(12) United States Patent
Medin et al.

(10) Patent No.: US 6,496,364 B1
(45) Date of Patent: Dec. 17, 2002

(54) UPGRADEABLE SYSTEM AND METHOD FOR CONNECTING A 1U PERSONAL COMPUTER

(75) Inventors: David T. Medin, Marion, IA (US); Scott Kayser, Cedar Rapids, IA (US); Robert D. Hinds, Mechanicsville, IA (US); Curtis R. Nelson, Cedar Rapids, IA (US)

(73) Assignee: Crystal Group Inc., Hiawatha, IA (US)

( * ) Notice: Subject to any disclaimer, the term of this patent is extended or adjusted under 35 U.S.C. 154(b) by 0 days.

(21) Appl. No.: 09/682,454

(22) Filed: Sep. 5, 2001

Related U.S. Application Data

(63) Continuation-in-part of application No. 09/681,120, filed on Jan. 12, 2001.

(51) Int. Cl.[7] ................................................. G05K 1/16
(52) U.S. Cl. ....................... 361/686; 361/724; 361/683; 312/223.1; 312/692; 439/62
(58) Field of Search .................................. 361/724–727, 361/683, 686, 679, 803; 312/223.1, 223.2, 223.3, 692; 439/325, 660, 61, 62

(56) References Cited

U.S. PATENT DOCUMENTS

| | | | | |
|---|---|---|---|---|
| 5,301,346 A | * | 4/1994 | Notarianni et al. | 361/686 |
| 5,460,441 A | * | 10/1995 | Hastings et al. | 312/223.2 |
| 5,761,033 A | * | 6/1998 | Wilhelm | 361/686 |
| 5,801,921 A | * | 9/1998 | Miller | 361/686 |
| 6,175,490 B1 | * | 1/2001 | Pap et al. | 361/686 |
| 6,273,730 B1 | * | 8/2001 | Chang | 439/629 |
| 6,297,962 B1 | * | 10/2001 | Johnson et al. | 361/726 |

* cited by examiner

Primary Examiner—Gerald Tolin
Assistant Examiner—Lisa Lea-Edmonds
(74) Attorney, Agent, or Firm—Simmons, Perrine, Albright & Ellwood, P.L.C.

(57) ABSTRACT

A system and method for blind-mateably electrically connecting a 1 U industrial personal computer with an industrial PC receiving bay in a rack, where the 1 U industrial personal computer has a first dedicated blind-mateable connector for standard equipment disposed on a bracket at the back end of an industrial PC and a second dedicated blind mateable connector for use with a later added expansion card, where the connectors are coupled to circuitry in the 1U industrial personal computer via jumper cables.

16 Claims, 3 Drawing Sheets

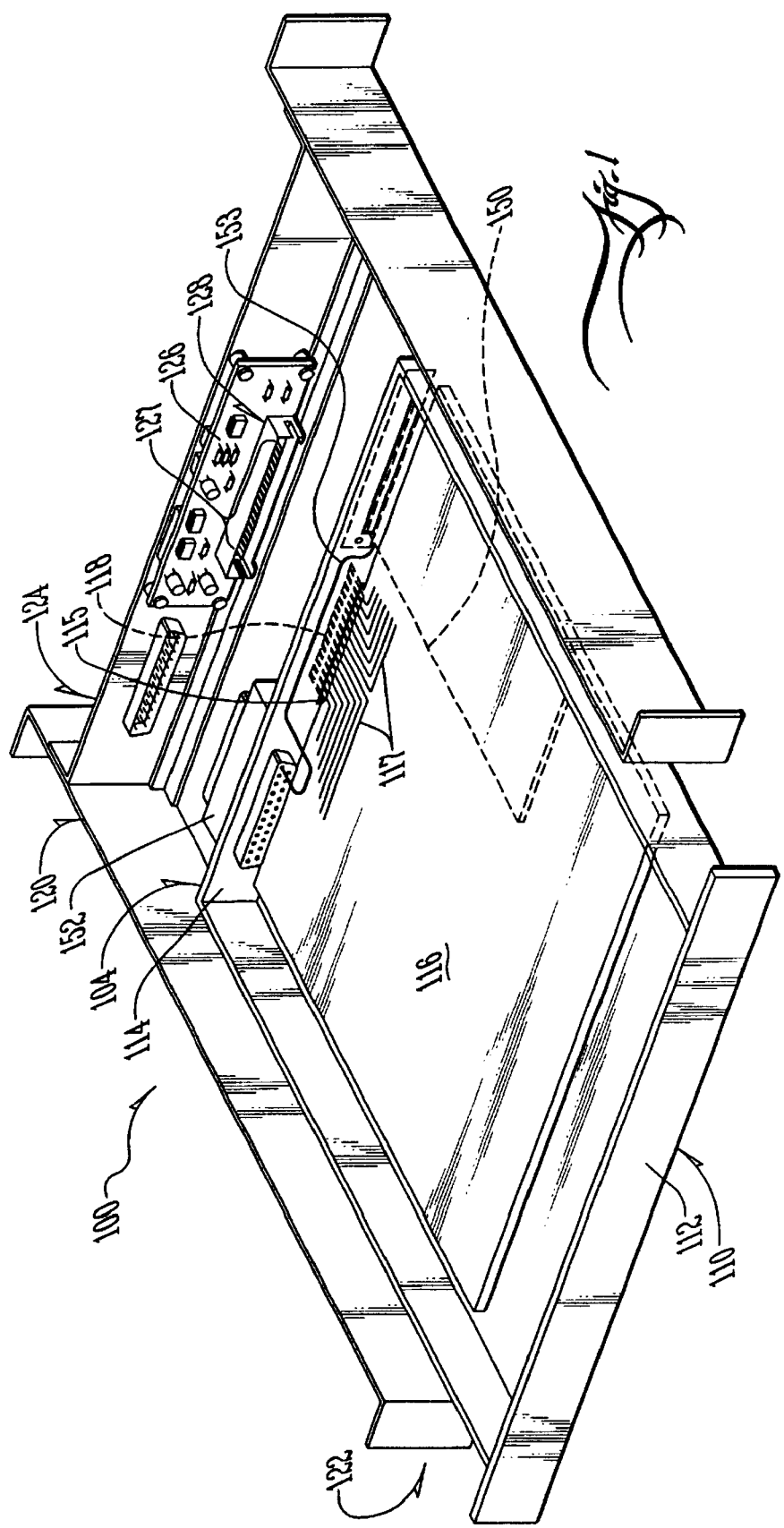

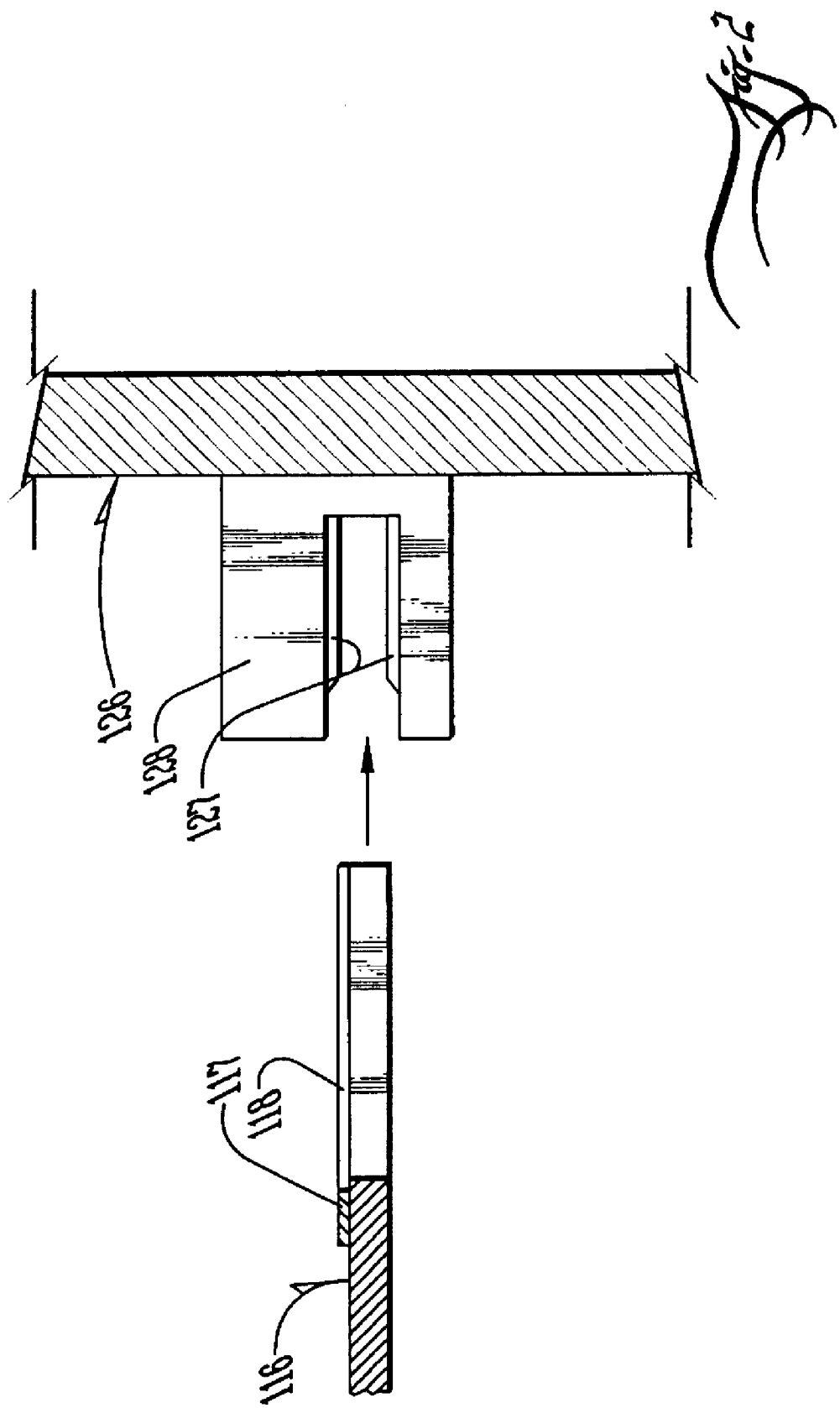

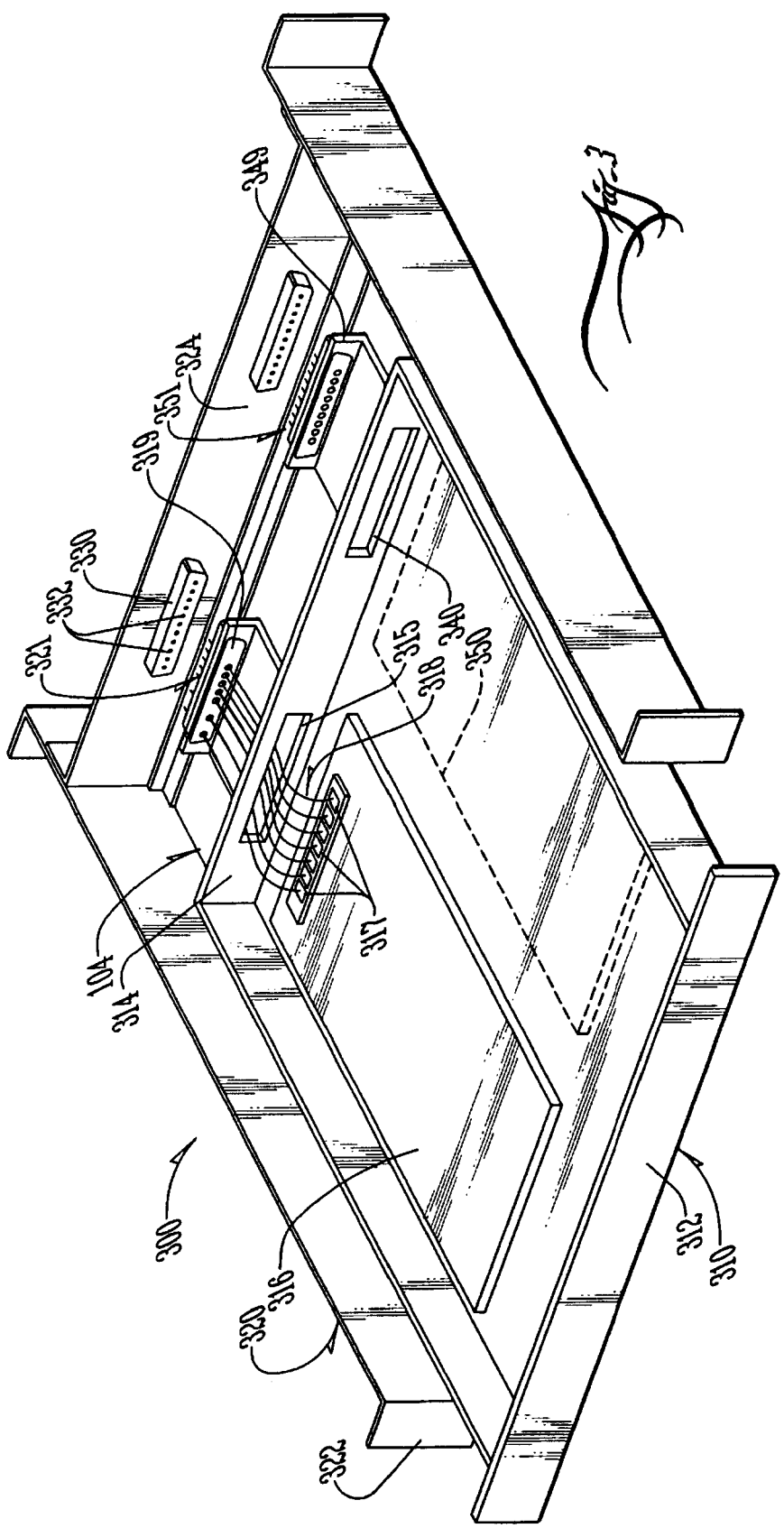

UPGRADEABLE SYSTEM AND METHOD FOR CONNECTING A 1U PERSONAL COMPUTER

CROSS REFERENCE TO RELATED APPLICATIONS

The present invention is a continuation-in-part application of and generally relates to co-pending U.S. patent application entitled "METHOD AND SYSTEM FOR QUICKLY CONNECTING A 1 U PERSONAL COMPUTER" filed on Jan. 12, 2001, by the same inventors and assigned to the same assignee and having Ser. No. 09/681,120, which application is incorporated herein in its entirety by this reference.

BACKGROUND OF INVENTION

In recent years, industrial personal computers have become increasingly prevalent in many industries. It is not uncommon today to see rows of industrial PCs arranged in racks. While many of these industrial PCs are often designed and manufactured to higher standards than consumer PCs, they still are occasionally in need of repair. Typically, when a repair is needed, the PC is removed from the rack and taken to a computer repair facility. To remove the PC from the rack requires disconnecting the numerous connections between the PC and the wiring in the rack. Full-size industrial computers have enjoyed much success with blind-mateable connectors between the PC and the rack.

While these blind-mateable connectors have been used extensively in the past with full-size industrial PCs, they do have some drawbacks when used with smaller 1 U industrial PCs. For example, the typical blind-mateable connectors may be too large to easily fit in the usable space in the back of a 1 U industrial PC. It has been generally accepted in the art of manufacturing 1 U industrial personal computers that the only way to connect the computer to a rack is to manually connect a wiring harness to a connector on the terminal end of the 1 U industrial personal computer 110.

Additionally, it is common practice to make configuration changes to these 1 U personal computers, such as adding expansion cards. Such changes would often require a new interconnection scheme between the 1 U computer and the rack.

Consequently, there exists a need for improved methods and systems for connecting 1 U industrial personal computers in an efficient manner.

SUMMARY OF INVENTION

It is an object of the present invention to provide a system and method for connecting a 1 U industrial personal computer in an efficient manner.

It is a feature of the present invention to utilize pin and socket connector on a bracket at the end of the rear of the case of the 1 U PC.

It is another feature of the present invention to include a first standard connector, dedicated to standard features of the PC, and a second custom connector, dedicated for use with any expansion cards.

It is an advantage of the present invention to achieve improved flexibility and efficiency in installation of 1 U industrial personal computers.

The present invention is an apparatus and method for installing 1 U industrial personal computers designed to satisfy the aforementioned needs, provide the previously stated objects, include the above-listed features, and achieve the already articulated advantages. The present invention is carried out in a "wasted time-less" manner in a sense that the time consumed with reconfiguring interconnections necessitated by addition or replacement of circuit cards within the PC, has been greatly reduced.

Accordingly, the present invention is a system and method including a 1 U industrial PC having a first PC blind mateable connector disposed thereon for cooperation with an associated first rack blind-mateable connector in the rack, and a second PC blind-mateable connector disposed thereon for cooperation with an associated second rack blind-mateable connector in the rack, where the first PC blind-mateable connector is dedicated for use with expansion cards disposed in said 1 U industrial computer.

BRIEF DESCRIPTION OF DRAWINGS

The invention may be more fully understood by reading the following description of the preferred embodiments of the invention, in conjunction with the appended drawings wherein:

FIG. 1 is a simplified perspective view of a system of the present invention.

FIG. 2 is an enlarged side view of a portion of the apparatus shown in FIG. 1.

FIG. 3 is a simplified perspective view of an alternate embodiment of the present invention where the dotted lines refer to a future expansion card disposed near a dedicated external connector.

DETAILED DESCRIPTION

Now referring to the drawings wherein like numerals refer to like matter throughout, and more specifically referring to FIG. 1, there is shown a system of the present invention generally designated 100, including a 1 U industrial personal computer 110 for insertion into an industrial PC receiving bay 120. The term "1 U" is well known in the art to describe a computer which is approximately 1¾ inches in height.

Throughout this description, the terms "industrial personal computer", "PC" or "industrial computer" are used to represent a PC of the type which is capable of being stored in racks of multiple rows of PCs, where each row has multiple PCs and where the PCs are coupled to wiring associated with the rack and other equipment by at least one connector at the rear end 104 of the PC 100. This definition of industrial PCs is not intended to include laptop PCs which have a connector on the rear end of the laptop for coupling with a docking station or a port replicator.

Consequently, the term "industrial PC" will specifically exclude any computer where the width dimension w is greater than three times the height dimension d and which has along its top side a hinged display screen which is hinged along the rear end of the PC. The terms "remotely monitored industrial PC" or "remotely monitored industrial computer" are hereby defined to include industrial computers with internal apparatus for monitoring the environmental conditions inside the PC, such as processor temperature, fan speeds, ambient internal temperature, etc. and for reporting the results of such monitoring to another computer which is not immediately adjacent thereto. The term "blind-mateable" is used to refer to the capability of mating two or more connectors with a process which does not require the computer technician or installer, etc. to actually see the connectors at the time they are being mated.

1 U industrial personal computer 110 has a faceplate 112 and an opposing terminal end 114 having a centrally disposed orifice 115 therein which could be a narrow slot or other configuration. Printed circuit board 116 represents any PC board in the 1 U industrial personal computer 110 which has a plurality of printed circuit traces 117 thereon which extend in a protuberant printed circuit trace member 118. In a preferred embodiment, the printed circuit board 116 may be an alarm card or another card which is coupled to an alarm or monitoring card which monitors environmental conditions inside 1 U industrial personal computer 110, such as processor temperature, fan speeds, internal ambient temperature, etc. Printed circuit board 116 would, in such a preferred embodiment, have electrical traces thereon which carry alarm signals which are representative of such measured environmental conditions inside said 1 U industrial personal computer 110. In a preferred embodiment, at least one of said printed circuit traces 117 is a trace carrying said alarm signals. Protuberant printed circuit trace member 118 protrudes from the 1 U industrial personal computer 110. The dotted lines represent the periphery of protuberant printed circuit trace member 118, as well as the printed circuit traces 117 disposed thereon, which are occluded from view by the terminal end 114. The alarm signals are preferably provided to another PC which monitors the 1 U industrial personal computer 110 from a distance.

Industrial PC receiving bay 120 is preferably one of many PC bays in a rack. Industrial PC receiving bay 120 has a PC bay front end 122 and a PC bay back end 124. Blind-mateable connector mount 126 is disposed on PC bay back end 124 and contains thereon blind-mateable connector assembly 128. Blind-mateable connector assembly 128 is shown as a plurality of conductive trace grasping contacts 127, which are adapted and configured to maintain contact with and accept electrical signals from printed circuit traces 117 when 1 U industrial personal computer 110 is inserted into industrial PC receiving bay 120, so that protuberant printed circuit trace member 118 mates with blind-mateable connector assembly 128.

A standard pin and socket connector 152 is also included on opposing terminal end 114. This may be either the male or female end of such a connector. Standard pin and socket connector 152 is provided to give additional functionality for a later installed expansion card 150, which is drawn in broken lines to better convey that such expansion card 150 is not installed in the 1 U industrial personal computer 10 at the time of manufacture, but is a later installed item. A connection line 153 is drawn from connector 152 to expansion card 150. It is drawn simply as a single line; however, it should be understood to represent numerous lines, as well as internal connectors for readily connecting with the expansion card 150.

A more detailed understanding of the present invention can be achieved by now referring to FIG. 2, which shows an enlarged side view of a portion of the apparatus shown in FIG. 1. Blind-mateable connector mount 126 is shown holding blind-mateable connector assembly 128, which has a pair of conductive trace grasping contacts 127. The conductive trace grasping contacts 127 can be biased toward maintaining contact with printed circuit traces 117 when protuberant printed circuit trace member 118 is inserted in blind-mateable connector assembly 128.

A preferred embodiment of the present invention is a blind-mateable circuit card protuberance and resilient contacts; however, other blind-mateable connectors could be used as well. For example, pin and socket-type connectors could be substituted.

In operation, the apparatus and method of the present invention as described in FIGS. 1–2, could function as follows:

1 U industrial personal computer 110 is inserted into industrial PC receiving bay 120. Protuberant printed circuit trace member 118 with printed circuit traces 117 thereon is thereby caused to fit into blind-mateable connector assembly 128 and be engaged by conductive trace grasping contacts 127 disposed therein. Electrical connections between the 1 U industrial personal computer 110 and the rack with industrial PC receiving bay 120 are thereby accomplished. The alarm signals representative of measured environmental conditions inside 1 U industrial personal computer 110, such as processor temperature, fan speed, and internal ambient temperature, are thereby communicated to a distant monitoring PC, which is coupled to a network, which is coupled to conductive trace grasping contacts 127 and blind-mateable connector assembly 128.

Now referring to FIG. 3, there is shown a system of the present invention generally designated 300, including a 1 U industrial personal computer 310 for insertion into an industrial PC receiving bay 320.

1 U industrial personal computer 310 has a faceplate 312 and an opposing terminal end 314 having an orifice 315 therein which could be a narrow slot or other configuration. Printed circuit board 316 represents any PC board in the 1 U industrial personal computer 310, which has a plurality of cable connectors 317 thereon which receive therein a plurality of jumper cables 318. In a preferred embodiment, the printed circuit board 316 may represent a motherboard, or passive backplane, which are considered standard circuitry in the 1 U industrial personal computer 310. The term "standard" is intended to mean original equipment installed by the manufacturer. Various standard signals will be provided on a plurality of jumper cables 318, depending on the configuration of printed circuit board 316. These standard signals are preferably "in-band" communication signals. "In-band" communication signals are defined to be signals which are communicated from the 1 U industrial personal computer 310 to some remote site, and the signals are dependent upon the main system processor of the 1 U industrial personal computer 310 remaining operational. Jumper cables 318 may be wires with some type of plug on each end jumper cables 318 could extend through orifice 315 and connect to an exterior connector 319 having a plurality of jumper cable plug receiving connectors thereon. Exterior connector 319 is spaced apart from terminal end 314 of 1 U industrial personal computer 310 by an "L" shaped bracket disposed thereon. Preferably the L-shaped bracket is sufficiently large so as to provide enough room for a technician to plug and unplug jumper cables 318 from exterior connector 319. The exterior connector 319 has a plurality of connecting pins 321, each coupled to one of said plurality of jumper cables 318. Connecting pins 321 are blind-mateable with a plurality of pin receiving sockets 332 disposed in a rack connector 330.

A phantom circuit card 350 is shown in dotted lines to represent that it is not standard equipment disposed in the 1 U industrial personal computer 310 at the time of manufacture. Phantom circuit card can be any type of expansion card, but it may preferably be an alarm card or another card which is coupled to an alarm or monitoring card which monitors environmental conditions inside 1 U industrial personal computer 310, such as processor temperature, fan speeds, internal ambient temperature, etc. Phantom circuit card 350 would, in such a preferred embodiment, have jumper cables connectors (not shown) thereon which, with expansion card jumper cables, (not shown) carry expansion card alarm signals which are representative of such measured environmental conditions inside said 1 U industrial personal computer 310. These expansion card jumper cables could be run through an orifice 340. The expansion card alarm signals are preferably provided to another PC, which monitors the 1 U industrial personal computer 310 from a distance. Preferably, these expansion card alarm signals are "out-of-band". The term "out-of-band" refers to signals which are communicated via a path separate from the in-band signals, and preferably these "out-of-band" signals continue despite the fact that the main system processor of the 1 U industrial personal computer 310 may have crashed and is no longer operational.

Industrial PC receiving bay 320 is preferably one of many PC bays in a rack. Industrial PC receiving bay 320 has a PC bay front end 322 and a PC bay back end 324.

A standard pin and socket connector 349 is also included on terminal end 314. This may be either the male or female end of such a connector. Standard pin and socket connector 349, with a plurality of expansion card connector pin 351 thereon, is provided to give additional functionality for the later phantom circuit card 350.

Throughout this description, reference is made to alarm signals, etc. It should be understood that any type of signal could be communicated using the present invention, such as, but not limited to, serial port signals, Ethernet and others, as well as providing power to the 1 U industrial personal computer.

Throughout this description, reference is made to an industrial PC and to a printed circuit board, because it is believed that the beneficial aspects of the present invention would be most readily apparent when used in connection with industrial PCs and printed circuit boards; however, it should be understood that the present invention is not intended to be limited to industrial PCs and printed circuit boards and should be hereby construed to include other non-industrial PCs and non-printed circuit boards as well.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

What is claimed is:

1. A system comprising:
   a 1 U industrial personal computer;
   a rack for containing a plurality of 1 U industrial personal computers;
   said 1 U industrial personal computer having a first blind-mateable PC connector thereon which mates to a first blind-mateable connector assembly coupled to rack;
   wherein said 1 U industrial personal computer has a terminal end with an orifice therein having a plurality of jumper cables extending therethrough to said first blind-mateable PC connector;
   wherein said first blind-mateable PC connector is mounted on a bracket on said terminal end of 1 U industrial personal computer; and
   wherein said bracket is an "L"-shaped bracket which is configured and sized to permit a technician's fingers to plug and un-plug said plurality of jumper cables.

2. A system of claim 1 wherein said plurality of jumper cables are coupled to a first circuit board disposed inside said 1 U industrial personal computer.

3. A system of claim 1 further comprising an empty expansion card slot, disposed in said 1 U industrial personal computer, configured and sized to receive an expansion card therein.

4. A system of claim 3 further comprising a second blind-mateable connector disposed on said terminal end which is not connected to any circuitry in said 1 U industrial personal computer, but is configured to receive expansion card jumper cables extending toward said slot.

5. A system of claim 4 wherein said expansion card is non-standard equipment.

6. A system of claim 4 wherein said expansion card is an alarm card.

7. A system of claim 6 wherein said second blind-mateable PC connector carries signals which are out-of-band signals.

8. A method of connecting a 1 U industrial personal computer comprising the steps of:
   providing a rack having a plurality of industrial PC receiving bays therein;
   providing a 1 U industrial personal computer, having standard equipment circuitry therein which couples to a first standard equipment blind-mateable connector carrying in-band communication signals;
   said 1 U industrial personal computer having an empty expansion card slot therein and a second standard equipment blind-mateable connector thereon which has pins therein which are not connected to any circuitry in said 1 U industrial personal computer;
   inserting said 1 U industrial personal computer into an industrial PC receiving bay in said rack;
   further inserting said 1 U industrial personal computer, so that said first standard equipment blind-mateable connector coupled to said 1 U industrial personal computer mates with a first blind-mateable connector assembly coupled to said rack;
   communicating with a remote pc, via in-band signals carried by said first standard equipment blind-mateable connector;
   removing said 1 U industrial personal computer from said rack and inserting an expansion card into said empty expansion card slot;
   coupling said expansion card to said second standard equipment blind-mateable connector; and
   reinserting said 1 U industrial personal computer into said rack.

9. A method of claim 8 further comprising communicating alarm signals via said second standard equipment blind-mateable connector.

10. A method of claim 9 wherein said alarm signals are out-of-band signals which are carried over a plurality of jumper cables extending through an orifice in a terminal end of said 1 U industrial personal computer and extending between said second blind-mateable connector and said expansion card.

11. A method of claim 10 further comprising the step of monitoring a temperature characteristic of a main system processor in said 1 U industrial personal computer, and generating said alarm signals in response thereto.

12. A method of claim 11 further comprising monitoring said alarm signals at a monitoring PC coupled to a network, where said monitoring PC is not adjacent to said 1 U industrial personal computer.

13. An apparatus comprising:
   a 1 U industrial personal computer;
   a rack having a plurality of industrial PC receiving bays; and,
   first standard means for blind-mateably electrically connecting said 1 U industrial personal computer with a network via in-band signals; and,
   second standard means for blind-mateably connecting connector pins and sockets which are not coupled to any circuitry in said 1 U industrial personal computer.

14. An apparatus of claim 13 further comprising means for receiving an expansion card therein.

15. An apparatus of claim 14 wherein said second standard means for blind-mateably connecting connector pins and sockets is configured for receiving therein jumper cables, extending through an orifice in a terminal end of said 1 U industrial personal computer, toward said means for receiving an expansion card.

16. An apparatus of claim 15 wherein said 1 U industrial personal computer is substantially 1 and ¾ inches in height.

* * * * *

UNITED STATES PATENT AND TRADEMARK OFFICE
CERTIFICATE OF CORRECTION

PATENT NO. : 6,496,364 B1
DATED : December 17, 2002
INVENTOR(S) : David T. Medin et al.

It is certified that error appears in the above-identified patent and that said Letters Patent is hereby corrected as shown below:

Title page,
Item [56], References Cited, U.S. PATENT DOCUMENTS, delete "Pap" and replace it with -- Papa --.

Column 3,
Line 44, delete "10" and insert therefor -- 110 --.

Column 4,
Line 41, delete "end jumper" and insert therefor -- end. Jumper --.

Signed and Sealed this

Thirteenth Day of May, 2003

JAMES E. ROGAN
*Director of the United States Patent and Trademark Office*